United States Patent
Lin

(10) Patent No.: US 8,953,328 B2
(45) Date of Patent: Feb. 10, 2015

(54) ELECTRONIC DEVICE WITH DETACHABLE MODULE

(75) Inventor: Chih-Hao Lin, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 251 days.

(21) Appl. No.: 13/468,046

(22) Filed: May 10, 2012

(65) Prior Publication Data

US 2013/0279123 A1 Oct. 24, 2013

(30) Foreign Application Priority Data

Apr. 20, 2012 (TW) .............................. 101114106 A

(51) Int. Cl.
*H05K 5/00* (2006.01)

(52) U.S. Cl.
USPC ............................ 361/730; 361/756; 361/801

(58) Field of Classification Search
USPC ......... 361/727, 756, 801–803, 754, 759, 796, 361/800, 752; 312/223.1, 223.2
See application file for complete search history.

(56) References Cited

U.S. PATENT DOCUMENTS

| | | | |
|---|---|---|---|
| 5,734,557 A * | 3/1998 | McAnally et al. ............ 361/727 |
| 7,265,986 B2 * | 9/2007 | Chen et al. .................... 361/726 |
| 7,602,612 B2 * | 10/2009 | Li ................................. 361/747 |
| 7,969,749 B2 * | 6/2011 | Prasantnakorn et al. ..... 361/823 |
| 8,611,099 B2 * | 12/2013 | Sun ............................... 361/754 |
| 8,743,563 B2 * | 6/2014 | Liang ........................... 361/802 |
| 2008/0266792 A1* | 10/2008 | Li et al. ........................ 361/695 |
| 2009/0255099 A1* | 10/2009 | Zhang et al. ................. 24/572.1 |

FOREIGN PATENT DOCUMENTS

| | | |
|---|---|---|
| TW | 532497 U | 5/2003 |
| TW | M324813 U | 1/2008 |
| TW | 200843613 A | 11/2008 |
| TW | M366863 U | 10/2009 |

* cited by examiner

*Primary Examiner* — Hung S Bui
(74) *Attorney, Agent, or Firm* — Novak Druce Connolly Bove + Quigg LLP

(57) ABSTRACT

An electronic device includes a chassis, a detachable module received in the chassis, and a latching member. The detachable module includes an end plate defining an opening. One end of the latching member is fixed in the detachable module, and the other end of the latching member extends out of the detachable module through the opening. The detachable module defines a through hole. The chassis defines a latching hole corresponding to the through hole. A latching block protrudes out from one side of the latching member and extends through the through hole to engage in the latching hole. A shielding piece comes across to block and shield the opening.

7 Claims, 4 Drawing Sheets

ELECTRONIC DEVICE WITH DETACHABLE MODULE

BACKGROUND

1. Technical Field

The present disclosure relates to an electronic device having a detachable module.

2. Description of Related Art

In an electronic device, such as a computer or a server, detachable modules, such as power modules, may be fixed in a chassis of the electronic device by a latching member. The detachable module includes a chassis defining an opening for removably receiving the latching member. However, the opening is exposed to the outside of the electronic device, and allows electromagnetic radiation to enter and be emitted from the electronic device.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
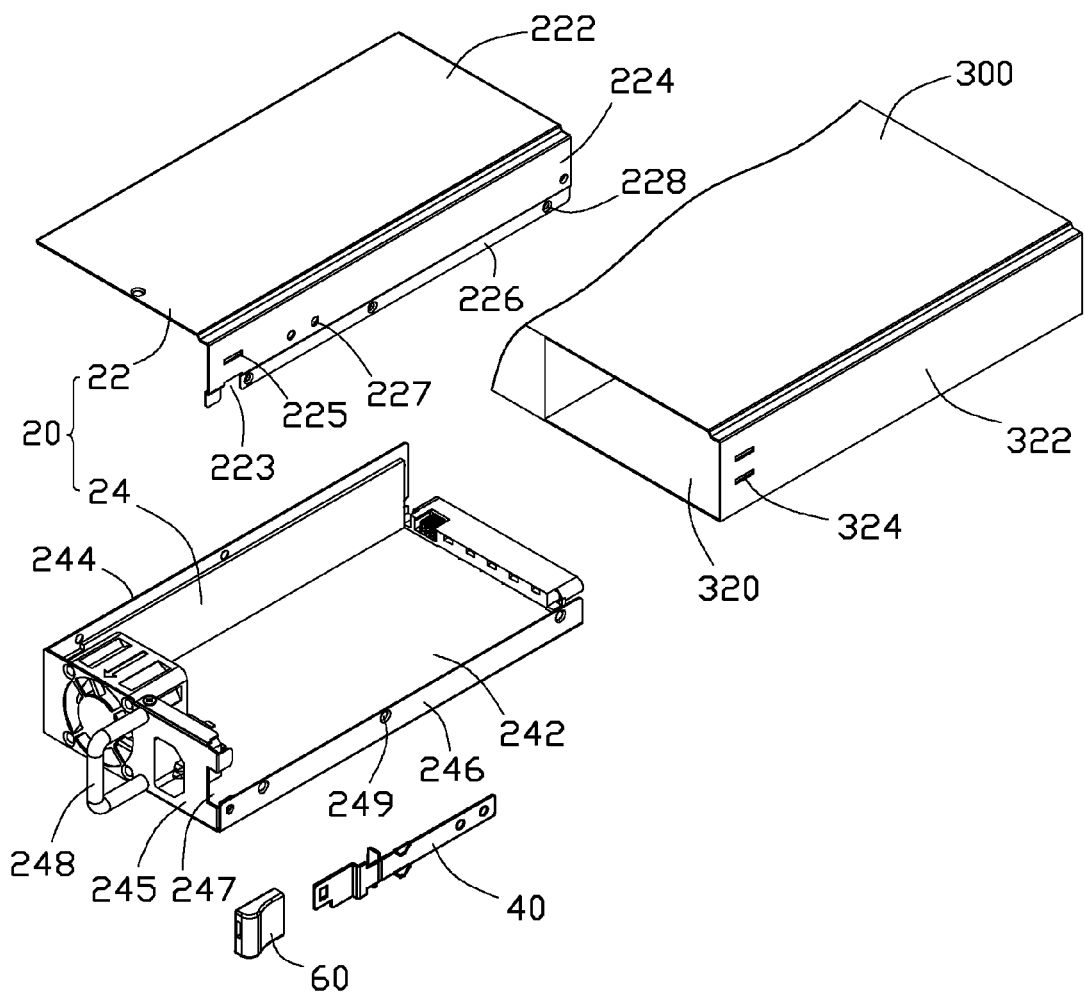
FIG. 1 is an exploded, isometric view of an embodiment of an electronic device, wherein the electronic device includes a latching member.

Referring to FIG. 1, an embodiment of an electronic device includes a chassis 300, a detachable module 20, and a latching member 40. A plurality of components (not shown), such as a motherboard and a data storage apparatus, is installed in the chassis 300. The chassis 300 includes a sidewall 322 bounding a receiving space 320. The sidewall 322 defines two rectangular latching holes 324 communicating with the receiving space 320. In the embodiment, the chassis 300 is a server enclosure, and the detachable module 20 is a power module.

The detachable module 20 includes a top casing 22 and a bottom casing 24.

The top casing 22 includes a rectangular top plate 222, a side plate 224 perpendicularly extending down from a side of the top plate 222, and a flange 226 protruding down from a bottom side of the side plate 224. A rear end of the side plate 224 defines a though hole 225, a cutout 223 below the through hole 225, and two connecting holes 227 adjacent to the through hole 225. The flange 226 defines a plurality of screw holes 228. The cutout 223 extends through the flange 226.

The bottom casing 24 includes a rectangular bottom plate 242, a side plate 244 perpendicularly extending up from a first side of the bottom plate 242, an end plate 245 perpendicularly extending up from a rear end of the bottom plate 242, and an engaging plate 246 perpendicularly extending up from a second side of the bottom plate 242 opposite to the side plate 244. The end plate 245 defines an opening 247 adjacent to the engaging plate 246. A U-shaped handle 248 extends out from a middle of the end plate 245. The engaging plate 246 defines a plurality of through holes 249.

Figure 2:
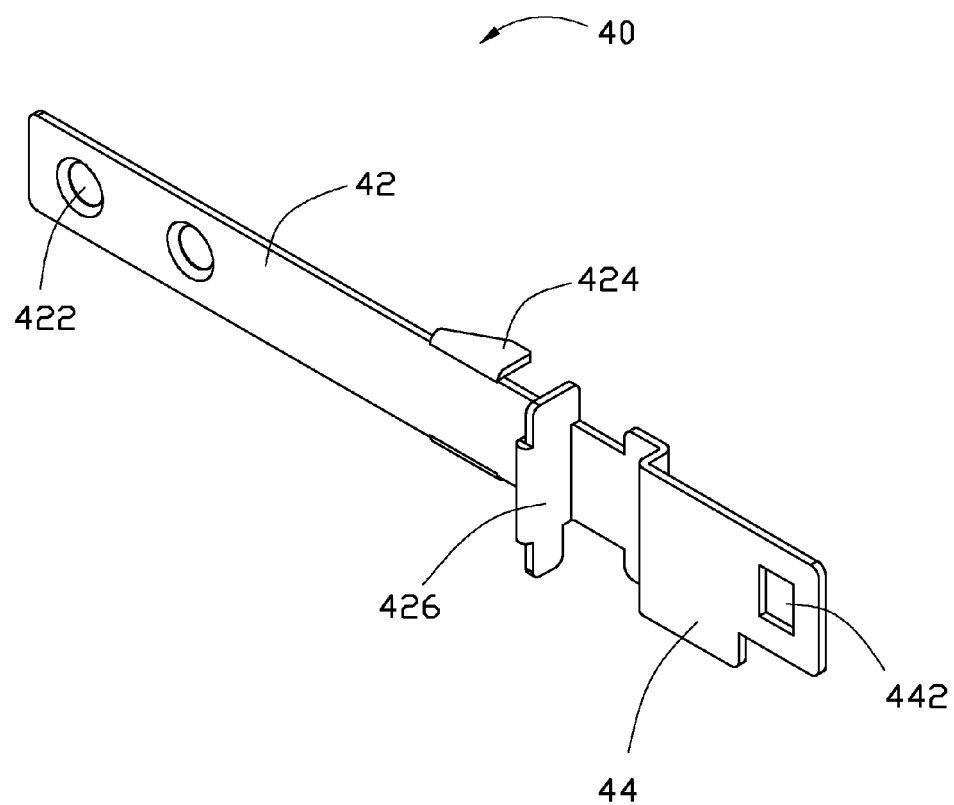
FIG. 2 is enlarged view of the latching member of FIG. 1, but viewed from another perspective.

Referring to FIG. 2, the latching member 40 is essentially a strip of material, and includes a resilient connecting plate 42 and a substantially L-shaped operation plate 44 extending in from a rear end of the connecting plate 42. The interior end of the connecting plate 42 defines two fastening holes 422. Wedge-shaped latching blocks 424 extend out from a top side and a bottom side of the connecting plate 42, between the fastening hole 422 and the operation plate 44. A shielding piece 426 perpendicularly extends in from the connecting plate 42, between the latching blocks 424 and the operation plate 44. The shielding piece 426 is made of electromagnetic interference (EMI) shielding material. A distal end of the operation plate 44 opposite to the connecting plate 42 defines a positioning hole 442.

In the embodiment, the latching member 40 is resilient, and made of EMI shielding material, such as steel, and is integrally formed.

A handle 60 may be fastened to the operation plate 44. The handle 60 is made of soft material, such as plastic or rubber. A middle of the handle 60 defines an inserting slot 62 (shown as FIG. 4), and a resilient tab 64 protrudes from an inner sidewall bounding the inserting slot 62.

Figure 3:
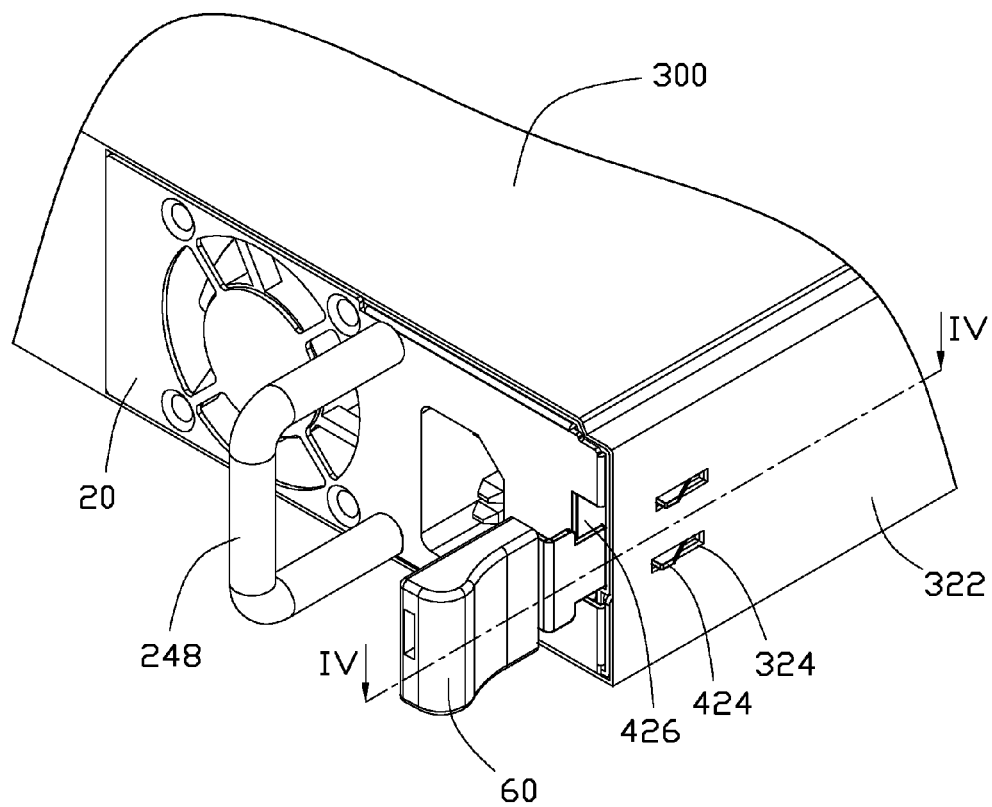
FIG. 3 is an assembled, isometric view of the electronic device of FIG. 1.
Figure 4:
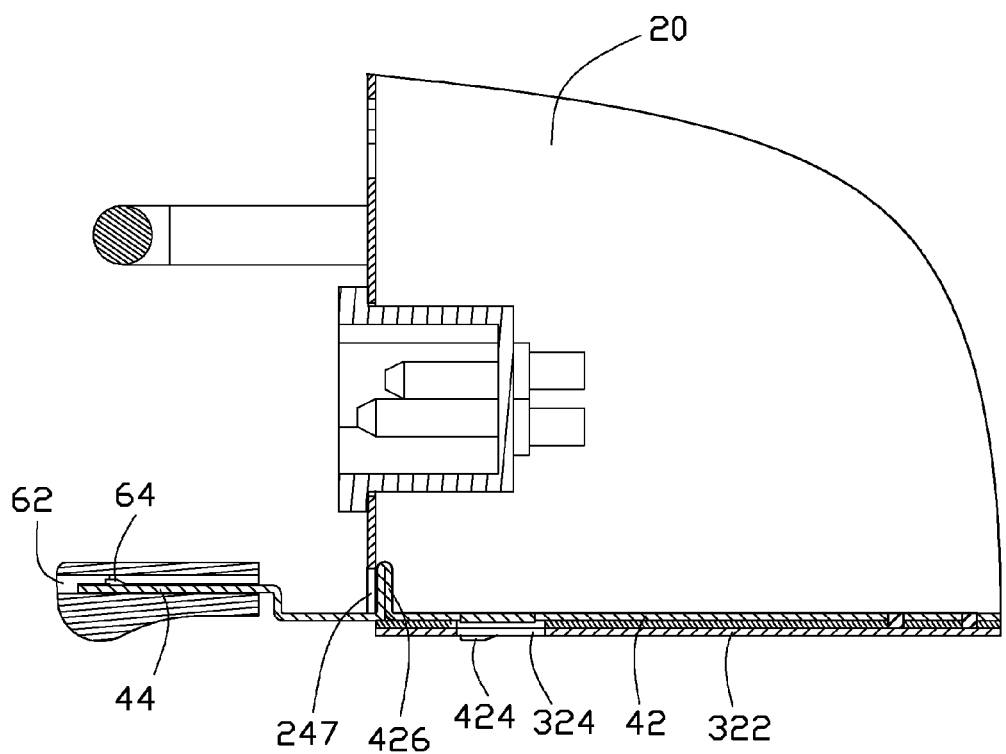
FIG. 4 is a sectional view of FIG. 3, taken along the line of IV-IV.

Referring to FIGS. 3-4, in assembly, two rivets extend through the fastening holes 422 of the latching member 40 to fasten into the connecting holes 227 of the top casing 22, thereby fixing the connecting plate 42 on an inner surface of the side plate 224. The operation plate 44 extends out of the top casing 22. The latching blocks 424 extend through the through hole 225 and the cutout 223 of the top casing 22.

A combination of the top casing 22 and the latching member 40 is installed on the bottom casing 24. The operation plate 44 is extended through the opening 247. The flange 226 abuts an inner surface of the engaging plate 246. A plurality of screws extends through the through holes 249 of the engaging plate 246, to screw into the screw holes 228. The operation plate 44 is inserted into the inserting slot 62 of the handle 60. The tab 64 is latched in the positioning hole 442. The shielding piece 426 abuts an inner surface of the end plate 245, to cover and shield the opening 247.

In assembly of the detachable module 20 to the chassis 300, the detachable module 20 is inserted into the receiving space 320. The latching blocks 424 slide in against an inner surface of the sidewall 322, deforming the connecting plate 42 inwards, until the latching blocks 424 align with the latching holes 324. The connecting plate 42 then restores to engage the latching blocks 424 in the latching holes 324. The shielding piece 426 is abuts the inner surface of the end plate 245, to shield the opening 247, to prevent electromagnetic radiation from entering or being emitted from the detachable module 20.

When disassembling the detachable module 20, the handle 60 is manipulated towards the handle 248, thereby deforming the connecting plate 42 and disengaging the latching blocks 424 from the latching holes 324. The handle 248 is pulled by hand, and thereby the detachable module 20 may be easily separated from the chassis 300.

It is to be understood, however, that even though numerous characteristics and advantages of the embodiments have been set forth in the foregoing description, together with details of the structure and function of the embodiments, the present disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. An electronic device, comprising:
   a chassis comprising a sidewall bounding a receiving space, the sidewall defining a latching hole communicating with the receiving space;
   a detachable module detachably received in the receiving space, comprising an end plate defining an opening; and
   a resilient latching member comprising a first end fixed to an inner surface of the detachable module, and a second end opposite to the first end and extending out of the detachable module through the opening, wherein the detachable module defines a through hole corresponding to the latching hole, a latching block protrudes from the latching member and extends through the through hole to engage in the latching hole, a shielding piece protrudes from the latching member and shields the opening;
   wherein the detachable module comprises a bottom casing and a top casing installed on the bottom casing, the top casing comprises a top plate and a side plate extending down from a side of the top plate, the through hole is defined in a rear end of the side plate, the bottom casing includes a bottom plate, the end plate is extended up from a rear end of the bottom plate, the opening is defined in the end plate adjacent to the side plate; and
   wherein the latching member comprises a resilient connecting plate and an operation plate extending from a rear end of the connecting plate, a front end of the connecting plate away from the operation plate is fixed to an inner surface of the side plate of the top casing, the operation plate extends out of the detachable module through the opening, the shielding piece extends in from the connecting plate, between the latching block and the operation plate, to engage with an inner surface of the end plate.

2. The electronic device of claim 1, wherein the latching block and the shielding piece respectively extend from two opposite side surfaces of the connecting plate.

3. The electronic device of claim 1, wherein an engaging plate extends up from a side of the bottom plate adjacent to the opening, a flange extends down from a bottom side of the side plate of the top casing, to abut against an inner surface of the engaging plate.

4. The electronic device of claim 1, wherein a handle extends out from a middle of the end plate of the bottom casing.

5. The electronic device of claim 1, wherein the lathing member is made of resilient electromagnetic interference shielding material.

6. The electronic device of claim 1, wherein the latching member is made of resilient steel piece.

7. The electronic device of claim 1, wherein the detachable module is a power module.

* * * * *